United States Patent
Taguchi et al.

(10) Patent No.: US 6,537,855 B2
(45) Date of Patent: Mar. 25, 2003

(54) SEMICONDUCTOR DEVICE AND METHOD OF MANUFACTURING THE SAME

(75) Inventors: Yutaka Taguchi, Osaka (JP); Tetsuyosi Ogura, Osaka (JP); Hideki Iwaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 158 days.

(21) Appl. No.: 09/827,074

(22) Filed: Apr. 5, 2001

(65) Prior Publication Data

US 2001/0019173 A1 Sep. 6, 2001

Related U.S. Application Data

(62) Division of application No. 09/558,470, filed on Apr. 24, 2000, now Pat. No. 6,348,739.

(30) Foreign Application Priority Data

Apr. 28, 1999 (JP) ............................................ 11-122101

(51) Int. Cl.⁷ .......................... H01L 21/44; H01L 21/48; H01L 21/50
(52) U.S. Cl. ....................... 438/118; 438/108; 438/119; 438/613
(58) Field of Search ................................ 438/613, 612, 438/611, 614, 108, 118, 119, FOR 369; 228/180.22

(56) References Cited

U.S. PATENT DOCUMENTS

| | | | | |
|---|---|---|---|---|
| 3,903,592 A | * | 9/1975 | Heckl | 438/571 |
| 5,172,050 A | * | 12/1992 | Swapp | 324/762 |
| 5,485,010 A | * | 1/1996 | Owen et al. | 250/332 |
| 5,686,353 A | * | 11/1997 | Yagi et al. | |
| 5,712,504 A | | 1/1998 | Yano et al. | |
| 5,734,199 A | * | 3/1998 | Kawakita et al. | 257/737 |
| 5,847,390 A | * | 12/1998 | Long et al. | 250/332 |
| 5,912,913 A | * | 6/1999 | Kondow et al. | 372/45 |
| 6,133,065 A | * | 10/2000 | Akram | 438/108 |
| 6,136,623 A | * | 10/2000 | Hofstetter et al. | 438/28 |
| 6,175,157 B1 | * | 1/2001 | Morifuji | 257/777 |
| 6,437,439 B1 | * | 8/2002 | Shimoe | 257/734 |

FOREIGN PATENT DOCUMENTS

| | | | | |
|---|---|---|---|---|
| JP | 57042175 A | * | 3/1982 | H01L/31/10 |
| JP | 4-167567 | | 6/1992 | |
| JP | 9-213988 | | 8/1997 | |
| JP | 00349113 A | * | 12/2000 | H01L/21/60 |

OTHER PUBLICATIONS

"An InP/InGaAs p–I–n/HBT Monolithic Transimipedance Photoreceiver", Chandrasekhar et al., IEEE Photonics Technology Letters, vol. 2, No. 7, Jul. 1990.
"Monolithic pin–Hemt Receiver with Internal Equalizer for Long–Wavelength Fibre Optic Communications", Yano et al., Electronic Letters, vol. 26, No. 5, Mar. 1, 1990.

* cited by examiner

Primary Examiner—Olik Chaudhuri
Assistant Examiner—Michelle Estrada
(74) Attorney, Agent, or Firm—Merchant & Gould P.C.

(57) ABSTRACT

A first bump and a second bump are formed on the surface of a mounting board (substrate) so that the second bump is allowed to be higher than the first bump. A conductive adhesive member is transferred onto those bumps. A semiconductor substrate in which a mesa portion has been processed is mounted on the mounting board so that the first bump does not come into contact with an electrode on a top of the mesa portion directly while electrically connected to the electrode via the conductive adhesive member. In the semiconductor device in which the semiconductor substrate is mounted with an active surface processed to form the mesa portion facing the mounting board, the stresses applied to the mesa portion (a stress caused in mounting and a stress due to a heat cycle in use) are relieved, thus preventing deterioration of an element.

2 Claims, 3 Drawing Sheets

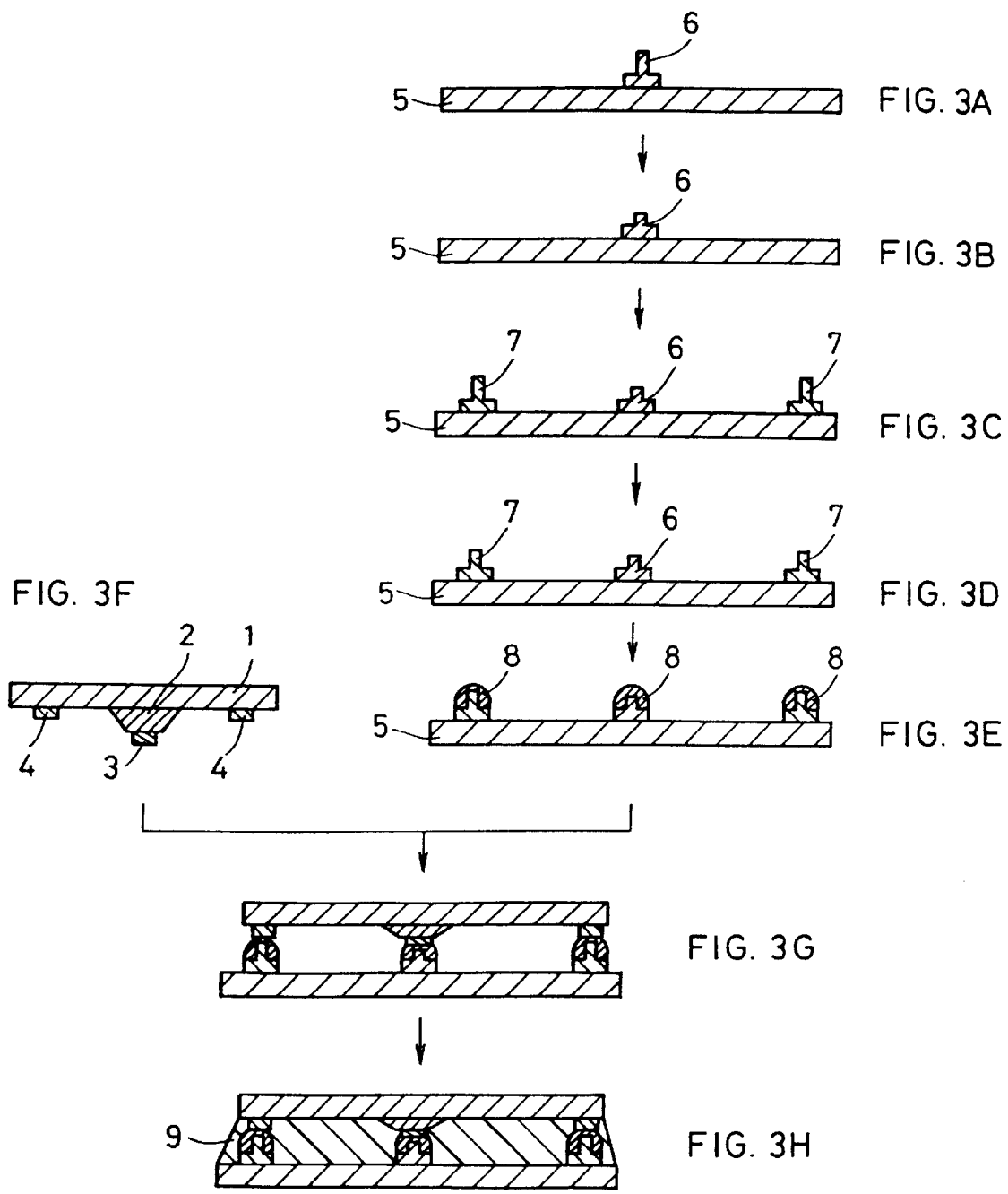

SEMICONDUCTOR DEVICE AND METHOD OF MANUFACTURING THE SAME

"This application is a divisional of application Ser. No. 09/558,470, filed Apr. 24, 2000 now U.S. Pat. No. 6,348,739, which application(s) are incorporated herein by reference."

FIELD OF THE INVENTION

The present invention relates to a semiconductor device in which a semiconductor component is mounted on a substrate and to a method of manufacturing the same. More particularly, the present invention relates to a semiconductor device in which a semiconductor component such as, for example, an optical semiconductor component is mounted, which has a surface processed to form a mesa portion with an active region of a semiconductor therein and an electrode on the top of the mesa portion.

BACKGROUND OF THE INVENTION

With developments in optical communication, there have been demands for inexpensive high-performance modules for optical communication. Particularly, when transmitting image information, a photo-detecting module with high sensitivity over a wide band is required. For obtaining such a module, a pin junction diode (a positive-intrinsic-negative photodiode) or an avalanche phenomenon photodiode (an avalanche photodiode) has been used. Examples of such components have been disclosed in JP 9-213988 A, "IEEE Photonics Technology Letters vol.2, no.7 pp.505–506, 1990", and "Electronics Letters, vol.26, no.5, pp.305–307, 1990".

Generally, those components have a so-called mesa portion obtained by allowing an active layer to grow on a semiconductor substrate and removing portions other than necessary portions by etching. In such a structure with a mesa portion, electrodes are provided on the substrate and the top of the mesa portion. However, the active layer is provided directly under the top of the mesa portion and therefore such a component is quite vulnerable to an impact. Therefore, it is difficult to connect the electrode on the top of the mesa portion formed by evaporation or the like to an external electrode with a wire (wire bonding). A semiconductor substrate (a semiconductor component) having an active surface processed to form a mesa portion is mounted on a substrate with a "face down" method using solder or the like in many cases.

Conventionally, in order to maintain reliability, generally an optical communication device has been sealed hermetically into a package. This package secures heat-cycle resistance, moisture resistance, or the like. However, as the optical communication comes into common use and comes to be introduced into domestic use, which previously has been limited to commercial use, much significance has come to be given to cost reduction in optical communication devices as in usual household electric appliances. Therefore, it has been required to secure the reliability without using a sealing package hindering the cost reduction.

With respect to the reliability, the greatest consideration must be given to deterioration caused by the heat cycle. Particularly, domestic equipment is switched on only when required, which is different from commercial equipment that is substantially in a working condition constantly. Therefore, the stress caused by the difference in thermal expansion between a semiconductor component and a substrate tends to deteriorate a semiconductor component. Especially, in a photodiode having a mesa portion provided with an electrode in its top portion, the deterioration tends to be remarkable.

Particularly, in the case of using a photodiode, the photodiode has a further smaller number of terminals compared to that in a general LSI, resulting in a heavy load per terminal when mounted. Therefore, the photodiode also tends to be affected by the stress when mounted. However, when the load merely is lightened, a sufficient electrical connection cannot be obtained, thus decreasing production yield.

SUMMARY OF THE INVENTION

In view of the above-mentioned circumstances, the present invention is intended to provide a highly reliable semiconductor device. Further, the present invention is intended to provide a method of manufacturing the semiconductor device, particularly a method enabling the deterioration of an element to be suppressed.

In order to achieve the above-mentioned object, a semiconductor device of the present invention includes: a semiconductor component having an active surface processed to form a mesa portion and an electrode formed on a top of the mesa portion; and a substrate on which the semiconductor component is to be mounted. The semiconductor component is mounted on the substrate so that the active surface is positioned on a side of the substrate. On the surface of the substrate, a first bump and a second bump are formed. The second bump is allowed to be higher than the first bump. Thus, the semiconductor component is mounted on the substrate with the first bump being electrically connected to the electrode via a conductive adhesive member without coming into contact with the electrode.

In the semiconductor device, it is preferable that the electrode formed on the top of the mesa portion is taken as a first electrode and a second electrode is formed on the semiconductor component, and the second bump is in contact with the second electrode. According to this preferable embodiment, together with the first bump, the second bump electrically connects the substrate and the semiconductor component while maintaining the space between the substrate and the semiconductor component.

It is preferable that a conductive adhesive member is positioned so as to contact with the second bump and the second electrode, since the reliability of the electrical connection in that location is increased.

In the semiconductor device, it is preferable that a plurality of second bumps are formed and have substantially the same height. The variation in height of the plurality of second bumps is not particularly limited, but suitably is 3 μm or less.

In the semiconductor device, a suitable space between the top of the first bump and the electrode formed on the top of the mesa portion is in a range between 1 μm and 10 μm, particularly between about 3 μm and 5 μm.

In the semiconductor device, at least one selected from, for example, solder and a conductive adhesive can be used as the conductive adhesive member.

In order to achieve the above-mentioned object, a method of manufacturing a semiconductor device of the present invention is a method of manufacturing a semiconductor device including: a semiconductor component having an active surface processed to form a mesa portion and an electrode formed on a top of the mesa portion; and a substrate on which the semiconductor component is to be mounted, with the semiconductor component being mounted on the substrate so that the active surface is positioned on a side of the substrate. The method includes: forming a first bump and a second bump on a surface of the substrate so that the second bump is allowed to be higher than the first bump; transferring a conductive adhesive member at least onto the first bump; mounting the semiconductor component on the substrate so that the first bump does not come into contact with the electrode while electrically connected to the electrode via the conductive adhesive member.

According to the method of manufacturing a semiconductor device of the present invention, it is preferred to form the first bump and the second bump so that the difference in height between the first bump and the second bump is allowed to be greater than the height of the mesa portion.

BRIEF DESCRIPTION OF THE DRAWINGS

FIGS. 3A–3H show process views of an embodiment of a method of manufacturing a semiconductor device according to the present invention.

DETAILED DESCRIPTION OF THE INVENTION

Preferable embodiments of the present invention are described as follows.

Figure 1:
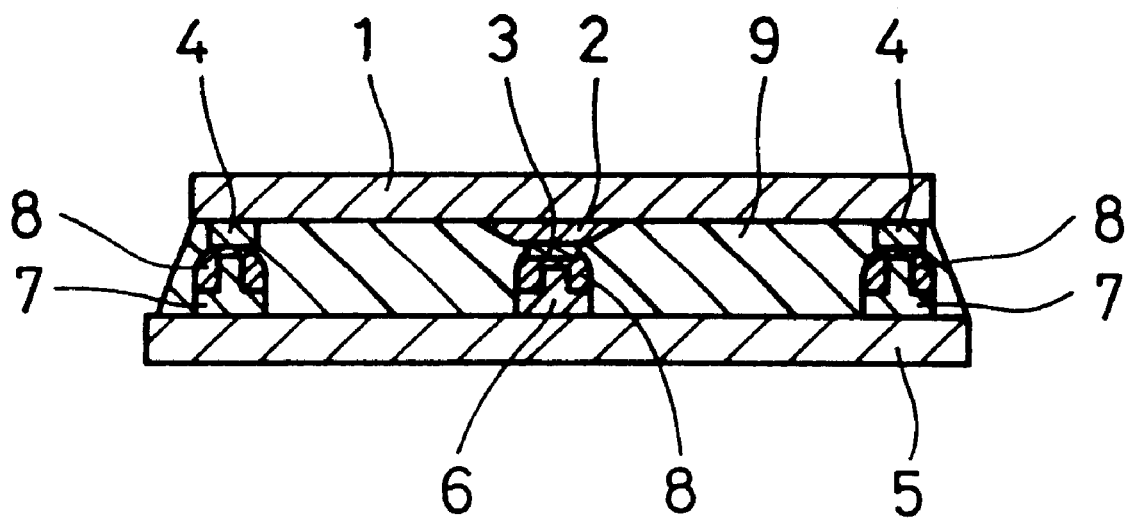
FIG. 1 is a sectional view of an embodiment of a semiconductor device according to the present invention.

FIG. 1 is a sectional view of an embodiment of a semiconductor device according to the present invention. A semiconductor component for this semiconductor device is a semiconductor substrate 1 on which a mesa portion 2 is formed. This semiconductor substrate 1 has a surface processed to have a mesa portion as an active surface and electrodes 3, 4 formed on the top of the mesa portion and in regions around the mesa portion on the active surface.

Figure 2:
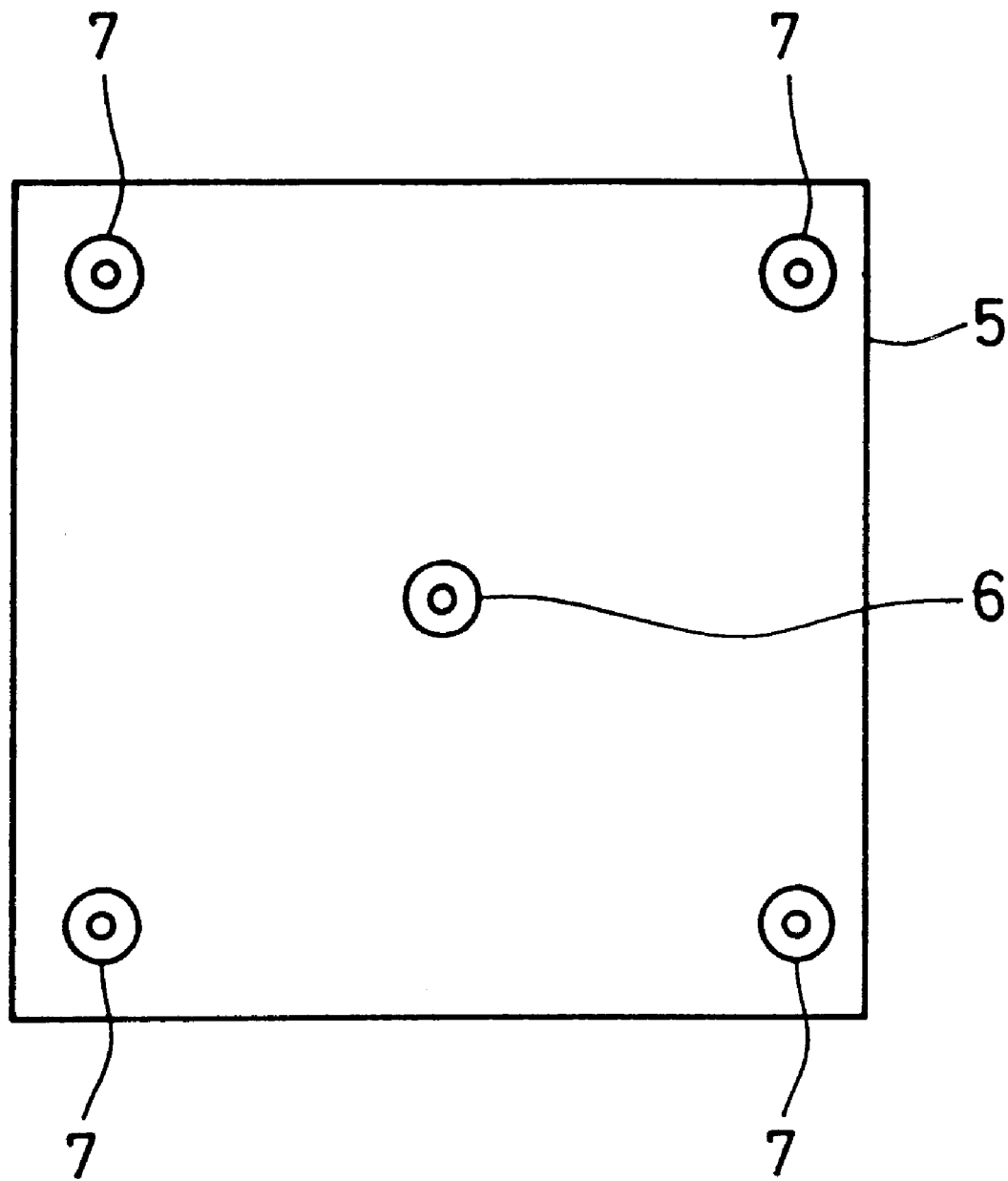
FIG. 2 is a plan view showing an example of bump arrangement on a mounting board used in the semiconductor device shown in FIG. 1.

On the other hand, a first bump 6 and second bumps 7 are preformed on a mounting board (substrate) 5. In the present embodiment, the bumps 6, 7 are positioned on the mounting board 5 as shown in FIG. 2. The first bump 6 is lower than the second bumps 7 and the difference in height between the first and second bumps is adjusted so as to be greater than the height of the mesa portion 2. The electrodes 3, 4 have substantially the same height. Therefore, when they are mounted (FIG. 1), the second bumps 7 are in contact with the electrodes 4 but the first bump 6 is not in contact with the electrode 3 directly although it is placed at a position corresponding to the electrode 3. The electrical connection between the first bump 6 and the electrode 3 is maintained by a conductive connection member 8.

In mounting of an LSI chip, usually bumps are formed on the LSI side. In this case, however, the bumps are formed on the board to relieve a damage to an element due to an impact in forming the bumps. Then, the bumps are sorted into the first and second bumps. The first bump mainly is used for electrical connection and the second bumps for spacing. However, the second bumps 7 are in contact with the electrodes 4 and also are used for forming a circuit between the mounting board 5 and the semiconductor substrate 1. Further, this semiconductor device preferably is sealed with sealing resin 9.

The first and second bumps also serve to maintain the conductive connection members in predetermined locations. When no bumps are provided, the conductive connection members may spread between the substrate 1 and the board 5 to come into contact one another, thus causing a short circuit.

When the electrode 3 formed by, for example, an evaporation method is extended up to a peripheral region of the mesa portion 2 to secure electrical connection in regions other than the mesa portion, the stress applied to the mesa portion can be relieved. However, this method may cause deterioration in characteristics of the semiconductor device. Particularly, this configuration is not suitable for maintaining a high frequency property of a photodiode. Such concern does not arise in the above-mentioned semiconductor device using the first bump and the conductive connection member.

The configuration of the above-mentioned semiconductor device is suitable particularly when a photodiode is formed with a mesa junction. When using a semiconductor component including a photodiode, the thickness of the semiconductor substrate 1 may be set to be, for example, about 50 $\mu$m to 200 $\mu$m and through the semiconductor substrate, external light may be introduced into the semiconductor device.

An embodiment of the method of manufacturing a semiconductor device according to the present invention is described with reference to FIGS. 3A–3H as follows.

Initially, a first metal bump 6 is formed on a mounting board 5 (FIG. 3A). As the mounting board, for instance, a ceramic substrate or a resin substrate may be used. As a metal bump, for example, a gold bump bonder can be used. Then, the height of the first metal bump 6 is adjusted to be a predetermined height (FIG. 3B). The adjustment of the height of the bump can be carried out by mechanical pressing, as generally is conducted.

Further, second metal bumps 7 are formed on the mounting board 5 (FIG. 3C). Similarly in this case, for example, a gold bump bonder can be used as in the case of the first metal bump. The first and second metal bumps 6 and 7 are formed at positions corresponding to electrodes 3 and 4 formed on a semiconductor substrate to be mounted. The height of the second metal bumps 7 is adjusted to be a predetermined height so as to allow the second metal bumps 7 to be higher than the first metal bump 6 (FIG. 3D). Thus, in the present embodiment, initially the first metal bump is formed and then the second metal bumps are formed. As described above, it is preferred to set the difference in height between the first and second bumps to be larger than the height of the mesa portion 2 on the semiconductor substrate 1 prepared separately (FIG. 3F).

Subsequently, conductive connection members 8 are transferred onto the first and second bumps 6 and 7 (FIG. 3E). For the conductive connection members, for instance, solder or a conductive adhesive can be used. As a solder, for example, cream solder made of an alloy of tin and silver can be used. The cream solder is suitable when a compound semiconductor (for example, GaAs, InP, or the like) is used as the semiconductor and gold is used as the electrode material in view of using the compound semiconductor. As the conductive adhesive, a thermoplastic adhesive is preferable, since a stress applied to an element such as a photodiode can be maintained at a low level even during a heat treatment. The conductive connection member may be transferred only onto the first metal bump. The transfer can be carried out using a transfer base as generally is conducted. When the conductive connection member is to be transferred only onto the first metal bump, a transfer base having a size corresponding to the region where this bump is provided may be used.

On the other hand, the mesa portion 2 and the electrodes 3 and 4 are formed on the semiconductor substrate 1 to prepare a semiconductor component (FIG. 3F). These electrodes can be deposited by, for example, an evaporation method. Then, the semiconductor component is placed on the board 5 with the first metal bump 6 and the electrode 3 on the top of the mesa portion being aligned, which then is treated with heat (FIG. 3G). In this embodiment, the semiconductor component is placed on the board, but they may be positioned reversibly. In other words, since usually the surface with bumps formed thereon is allowed to face down when an adhesive or the like is transferred, the board may be combined with the semiconductor component while maintaining this face-down orientation. On the contrary, the method of placing the semiconductor component on the board as shown in the figure s suitable when a plurality of components are placed on one board. When a plurality of semiconductor components are mounted on one board, which is then divided as required, the manufacturing cost can be suppressed.

After that, sealing resin 9 is injected and cured as required (FIG. 3H). The injection of the sealing resin 9 can improve the mechanical strength or moisture resistance.

In the steps described above, the mesa portion does not come into contact with the bump in mounting the semiconductor component. Furthermore, in a semiconductor device thus completed, the stress due to the heat cycle is not applied to the mesa portion easily. Thus, a semiconductor device with excellent reliability can be manufactured.

The application of the present invention is not limited to the abovementioned embodiment. The number or shape of respective members such as the bumps may be changed suitably as required. Further, for example, a protruding electrode formed by being baked at the same time the ceramic substrate is baked may be used as the first bump. In addition, for instance, bumps may be formed using gold or copper balls having approximately the same size. The present invention is particularly useful for a semiconductor device in which an optical semiconductor component is mounted, but is not limited thereto.

As described above, according to the present invention, a highly reliable semiconductor device can be provided. In addition, a method of manufacturing a semiconductor device can be provided, which enables the stress applied to an active region of a semiconductor component in mounting to be reduced.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a semiconductor device including: a semiconductor component having an active surface processed to form a mesa portion and an electrode formed on a top of the mesa portion; and a substrate on which the semiconductor component is to be mounted, the semiconductor component being mounted on the substrate so that the active surface is positioned on a side of the substrate, the method comprising:

forming a first bump and a second bump on a surface of the substrate so that the second bump is higher than the first bump;

transferring a conductive adhesive member at least onto the first bump; and mounting the semiconductor component on the substrate so that the first bump does not come into contact with the electrode while electrically connected to the electrode via the conductive adhesive member.

2. The method of manufacturing a semiconductor device according to claim 1, wherein the first bump and the second bump are formed so that difference in height between the first bump and the second bump is greater than a height of the mesa portion.

* * * * *